(12) United States Patent
Kishikawa et al.

(10) Patent No.: US 8,879,265 B2
(45) Date of Patent: Nov. 4, 2014

(54) ELECTRONIC CIRCUIT STORAGE CASE AND MANUFACTURING METHOD THEREOF

(75) Inventors: Naoyuki Kishikawa, Chiyoda-ku (JP); Hiroyuki Uramachi, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 186 days.

(21) Appl. No.: 13/268,077

(22) Filed: Oct. 7, 2011

(65) Prior Publication Data
US 2012/0273388 A1 Nov. 1, 2012

(30) Foreign Application Priority Data
Apr. 28, 2011 (JP) ................. 2011-100985

(51) Int. Cl.
*H01G 9/10* (2006.01)
*H05K 5/06* (2006.01)
*H05K 5/00* (2006.01)
*H05K 7/00* (2006.01)
*G06F 1/16* (2006.01)
*H01J 5/00* (2006.01)
*H01J 15/00* (2006.01)
*H01R 13/66* (2006.01)

(52) U.S. Cl.
CPC ................... *H05K 5/068* (2013.01)
USPC ...... 361/714; 361/518; 361/536; 361/679.01; 361/679.02; 174/50.5; 174/50.51; 174/50.52; 174/50.53; 174/17.05; 174/17.06; 174/17.07; 174/17.08; 439/620.01; 439/620.1; 439/620.18; 439/620.19; 439/620.22

(58) Field of Classification Search
USPC ............. 361/714, 518, 536, 679.01, 679.02; 73/204.21; 174/50.5–50.53, 174/17.05–17.08; 439/620.01, 620.1, 439/620.18, 620.19, 620.22
See application file for complete search history.

(56) References Cited

FOREIGN PATENT DOCUMENTS

| JP | 2004-055829 A |  | 2/2004 |  |
|---|---|---|---|---|
| JP | 2004055829 A | * | 2/2004 | ............... H05K 5/02 |
| JP | 2008-182089 A |  | 8/2008 |  |
| JP | 2008182089 A | * | 8/2008 |  |

\* cited by examiner

*Primary Examiner* — Anthony Haughton
*Assistant Examiner* — Zhengfu Feng
(74) *Attorney, Agent, or Firm* — Sughrue Mion, PLLC (57) ABSTRACT

An electronic circuit storage case includes a housing made of resin and having a case portion storing an electronic circuit board and a connector portion extending in a direction perpendicular to a board attachment surface of the case portion and incorporating a connector. Interior and exterior opening holes communicate at bottoms via a communication hole. A ventilating hole continuing from the interior of the case portion to the exterior of the connector portion is provided in a solid portion of the housing. The interior opening hole and the communication hole are bent in an L shape and provided to a primary resin mold part forming the housing. The exterior opening hole is provided to a secondary resin mold part of the housing enclosing the primary resin mold part and forming the connector and case portions so as to communicate with one end of the L-shaped communication hole substantially perpendicularly.

8 Claims, 7 Drawing Sheets

ELECTRONIC CIRCUIT STORAGE CASE AND MANUFACTURING METHOD THEREOF

BACKGROUND OF THE INVENTION

1. Field of the Invention

The present invention relates to an electronic circuit storage case provided with a ventilation portion that lessens an internal pressure change in a resin case occurring with an ambient temperature change, and to a manufacturing method thereof.

2. Background Art

When an electronic circuit storage case used for an electronic control unit installed in an engine room of an internal combustion engine is subject to high temperature in an actual use environment, an internal pressure of the case rises with a rising ambient temperature. In this instance, because a waterproof case portion has a sealed structure, assuming that there is no pressure escape, stress concentrates on a thin portion, a joint or the like of a case member and may possibly cause damage. Hence, in order to lessen this pressure, it is typical to provide a ventilating hole connecting the interior and the exterior of the case portion.

It should be noted, however, that a structure to release a pressure directly to the exterior from the case portion is contrary to the waterproof structure. It is therefore necessary to connect the ventilating hole to the interior using, for example, a connector portion.

In addition, because various electronic control units used in the engine room of the internal combustion engine are disposed in a narrow space, a layout thereof is limited and so is an insertion direction of a connector. It is therefore necessary to set an orientation of the connector portion by bending the connector portion with respect to an electronic control unit main body.

For an electronic circuit storage case provided with a ventilation portion, there is a related art technique described, for example, in Patent Document 1. A method adopted in this reference document is as follows. Firstly, a communication hole having opening holes respectively opening in three directions is molded using a die used to mold a case. After resin is allowed to cool and solidify, the molded resin is removed from the die. Subsequently, in a secondary processing work different from the molding, one of the opening holes respectively opening in three directions is closed by melting resin in the vicinity of this opening hole using a heated jig and letting the melted resin run into the opening hole. Further, an adhesive is applied on the top and the periphery of the closed opening hole and allowed to cure. Provided by this method is a communication hole allowing a communication from the exterior of the connector to the interior of the case and of a structure having two turns bent substantially at right angles in the interior.

There is another related art technique described, for example, in Patent Document 2. A method adopted in this reference document is as follows. That is, a ventilating hole is provided in a resin solid portion of a case portion. The ventilating hole has turns at two points and allows the case portion and a connector to communicate. The ventilating hole also has two spaced-apart opening holes opening in two directions to the exterior. An opening portion opening to an exterior of the case portion is provided by extending one end of a ventilating channel allowing a communication between the two turns. This opening is then closed by pre-heating resin in the vicinity of the opening portion and pushing the resin into the opening portion.

Patent Document 1: JP-A-2004-55829 (pp. 5-6, FIGS. 6 and 7)

Patent Document 2: JP-A-2008-182089 (pp. 4-6, FIGS. 4 through 14)

However, the methods of closing one of the opening holes respectively opening in three directions by melting the resin in the vicinity of the opening hole as in the related art techniques described in Patent Document 1 and Patent Document 2 described above have problems as follows. That is, the ventilating hole may be filled with excessively melted resin running therein from the opening hole and the resin may further pass through the opening hole and run into the ventilating hole.

Because the opening holes and the ventilating hole have to be formed in a limited space within the electronic control unit, each is normally formed to have a small passage cross section in the order of $\phi 1$ to 2 mm. Hence, even a slight amount of melted resin running into the ventilating hole is enough to close the ventilating hole. Further, in a case where an adhesive is applied on the top and the periphery of the closed opening hole, when the opening hole is not completely closed with the melted resin in the vicinity of the opening hole and a clearance is left in the preceding process, the adhesive runs into the opening hole through the clearance when the adhesive is applied thereon after the preceding process is completed. The adhesive may pass by the resin inside the opening hole and run into the ventilating hole, thereby closing the ventilating hole. In either case, the interior of the case portion is hermetically closed and it becomes impossible to lessen an internal pressure change occurring with a temperature change. Hence, there is a problem that the related art techniques may fail to achieve the intended purpose of the ventilating hole.

SUMMARY OF THE INVENTION

The invention was devised to solve the problems as discussed above and has an object to provide an electronic circuit storage case provided with a ventilating hole that lessens an internal pressure change in a resin case occurring with an ambient temperature change in a relatively easy and highly reliable manner.

An electronic circuit storage case according to an aspect of the invention includes a housing made of resin and having a case portion that stores an electronic circuit board and a connector portion that extends in a direction perpendicular to a board attachment surface of the case portion and incorporates a connector. An interior opening hole opening toward an interior of the case portion and an exterior opening hole opening toward an exterior of the connector portion communicate at bottoms via a communication hole. A ventilating hole continuing from the interior of the case portion to the exterior of the connector portion is provided in a solid portion of the housing. The interior opening hole and the communication hole are bent in an L-shape and provided to a primary resin mold part forming the housing. The exterior opening hole is provided to a secondary resin mold part of the housing enclosing the primary resin mold part and forming the connector portion and the case portion so as to communicate with one end of the L-shaped communication hole substantially perpendicularly.

According to a manufacturing method of the electronic circuit storage case configured as above, the primary resin mold part having the interior opening and the communication hole bent in an L shape is molded in a primary resin molding step of forming the housing and the entire housing including the connector portion and the case portion is formed in a secondary resin molding step together with the exterior opening hole connected to one end of the L-shaped communication hole substantially perpendicularly by holding the primary resin mold part at a predetermined position in dies and filling a cavity therein with resin.

The electronic circuit storage case configured as above is provided with the ventilating hole continuing from the interior of the case portion to the exterior of the connector portion in a solid portion of the housing. The interior opening hole and the communication hole are bent in an L shape and provided to the primary resin mold part forming the housing. The exterior opening hole is provided to the secondary resin mold part of the housing enclosing the primary resin mold part and forming the connector portion and the case portion so as to communicate with one end of the L-shaped communication hole substantially perpendicularly. Accordingly, a ventilating hole having two turns and allowing the case portion and the connector portion to communicate can be readily provided in a reliable manner merely by molding and an internal pressure change in the resin case can be lessened. It thus becomes possible to obtain an electronic circuit storage case provided with a highly reliable ventilating hole.

According to the manufacturing method of the electronic circuit storage case configured as above, the primary resin mold part having the interior opening hole and the communication hole bent in an L shape is molded in the primary resin molding step of forming the housing. The entire housing including the connector portion and the case portion is formed in the secondary resin molding step together with the exterior opening hole connected to one end of the L-shaped communication hole substantially perpendicularly by holding the primary resin mold part at a predetermined position in dies and filling a cavity therein with resin. Accordingly, the same advantage as above can be obtained.

The foregoing and other object, features, aspects, and advantages of the present invention will become more apparent from the following detailed description of the present invention when taken conjunction with the accompanying drawings.

DESCRIPTION OF THE PREFERRED EMBODIMENTS

Hereinafter, respective embodiments of the invention will be described with reference to the drawings. Same or similar members and portions are labeled with same reference numerals in all the drawings. Also, a description will be given to a case of a flow measuring device that measures an intake air flow of an internal combustion engine as a specific example of an electronic circuit storage case.

First Embodiment

Figure 1:
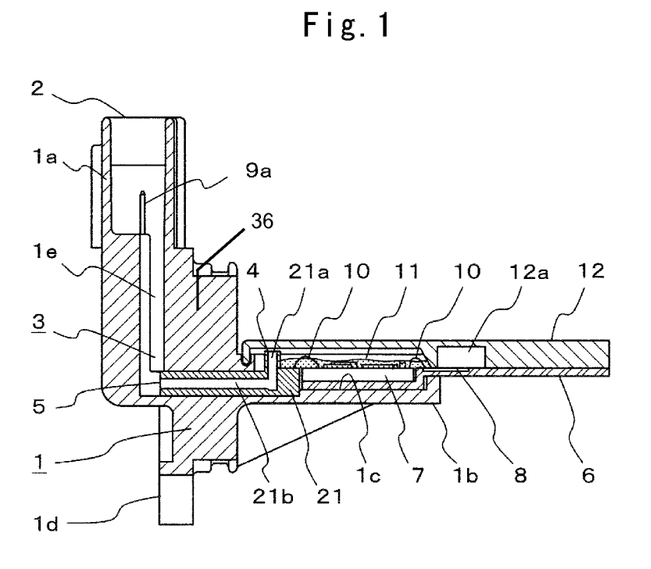
FIG. 1 is a sectional side view of a flow measuring device using an electronic circuit storage case according to a first embodiment of the invention.
Figure 2:
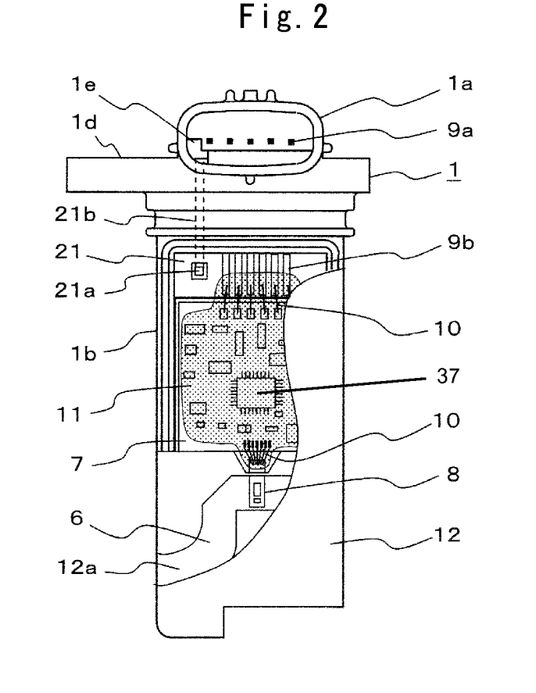
FIG. 2 is a front view of FIG. 1.
Figure 3A:
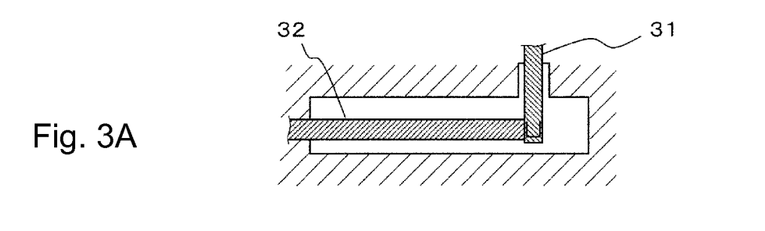
FIGS. 3A and 3B are cross sections used to describe a molding step of a primary resin mold part as a component forming a housing of FIG. 1.
Figure 3B:
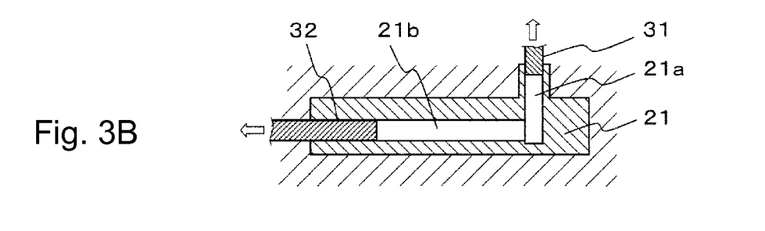
Figure 4A:
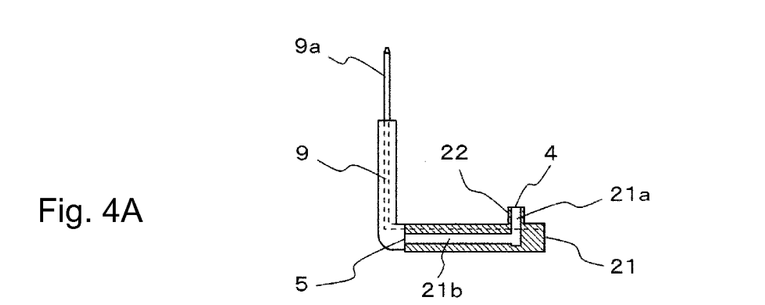
FIGS. 4A and 4B are views showing the primary resin mold part manufactured in the primary resin molding step of FIGS. 3A and 3B.
Figure 4B:
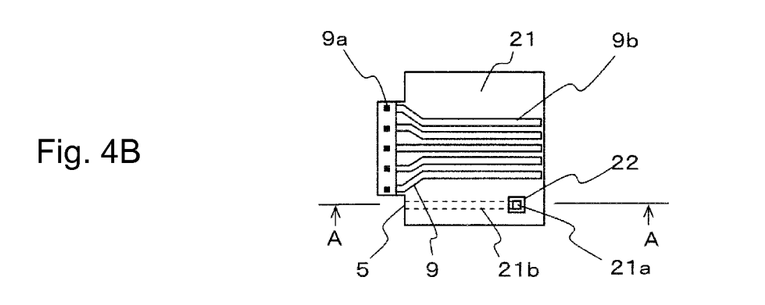
Figure 5:
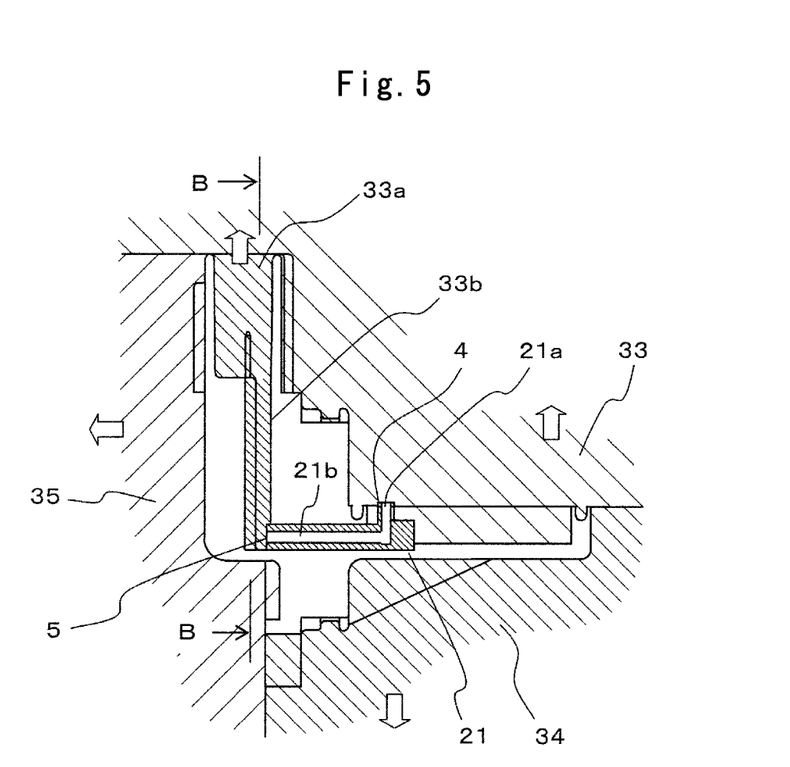
FIG. 5 is a cross section showing placement of dies when molding a secondary resin mold part as a component forming the housing of FIG. 1.
Figure 6:
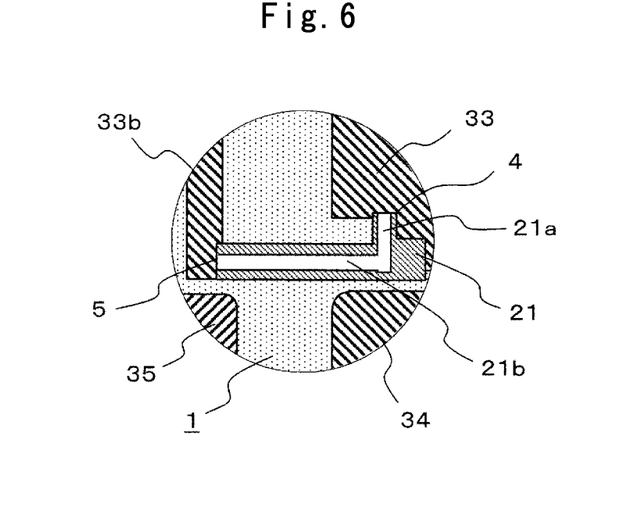
FIG. 6 is a detailed cross section of a major portion of FIG. 5.
Figure 7A:
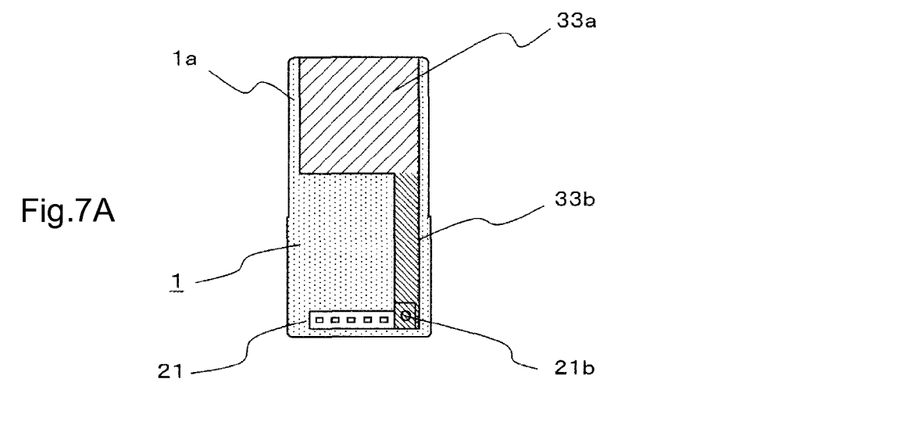
FIGS. 7A and 7B are cross sections taken on an arrow B-B of FIG. 5 used to describe a molding step of an exterior opening hole.
Figure 7B:
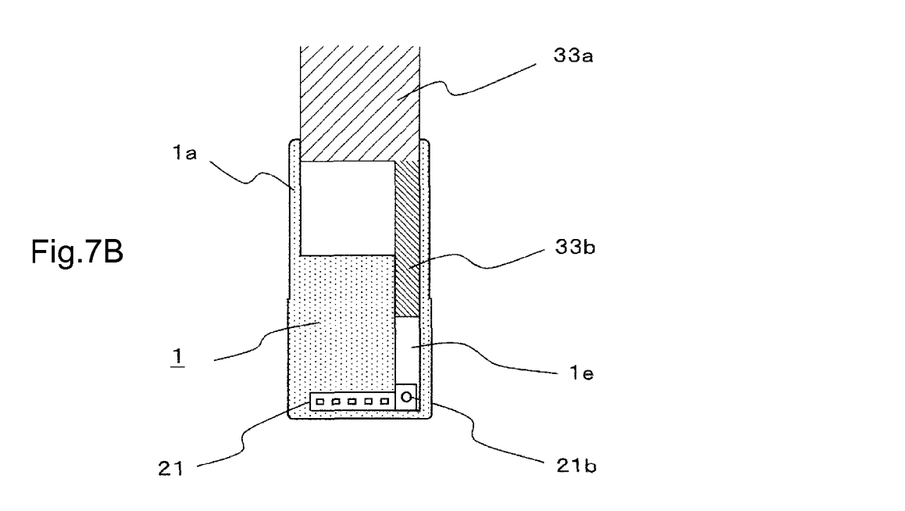
Figure 8:
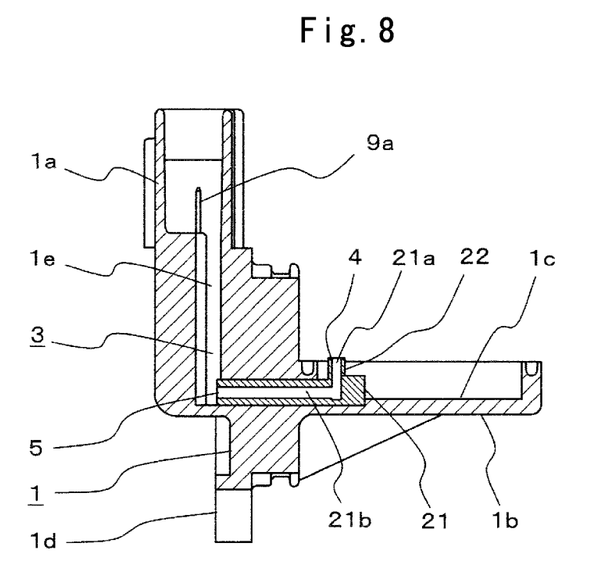
FIG. 8 is a sectional side view showing an overall housing after the secondary resin molding of the flow measuring device according to the first embodiment of the invention.

FIG. 1 is a sectional side view of a flow measuring device according to a first embodiment of the invention. FIG. 2 is a front view of the flow measuring device of FIG. 1 when viewed from a connector opening portion side. FIGS. 3A and 3B are views used to describe a molding step of a primary resin mold part as a component forming a housing of FIG. 1. FIGS. 4A and 4B are views showing the primary resin mold part formed according to FIGS. 3A and 3B. FIG. 5 is a cross section showing placement of dies during secondary resin molding to manufacture the housing of FIG. 1. FIG. 6 is a cross section of a major portion of FIG. 5. FIGS. 7A and 7B are cross sections taken on the arrow B-B of FIG. 5 and used to describe a secondary resin molding step of a connector portion. FIG. 8 is a sectional side view showing the overall housing after the secondary resin molding.

Firstly, an overall configuration of the flow measuring device will be described using FIG. 1 and FIG. 2.

A housing 1 is a resin molded article obtained by integrally molding a water-proof connector portion 1a exchanging electric signals with an exterior and a case portion 1b made into a storage portion of an electronic circuit board 7 described below. The connector portion 1a extends in a direction perpendicular to a board attachment surface 1c of the electronic circuit board 7 and is provided with a connector portion opening surface 2 substantially parallel to the board attachment surface 1c. Further, a flange portion 1d to be attached to an intake tube (not shown) of an internal combustion engine and fixed thereto with screws or the like is also formed integrally with the housing 1.

Strictly speaking, the electronic circuit board 7 is attached to the case portion 1b via a plate 6 described below. However, for ease of description, the inner surface side of the case portion 1b is referred to as the board attachment surface 1c.

One characteristic of the invention is that the housing 1 is molded separately in two steps in the process of molding: a primary resin molding step and a secondary resin molding step. Although it will be described in detail below, a primary resin mold part 21 molded in the primary resin molding step is disposed in the vicinity of an intermediate portion between the connector portion 1a and the case portion 1b and a portion enclosing the primary resin mold part 21 and made into the connector portion 1a, the case portion 1b, and the flange portion 1d is molded into one piece in the secondary resin molding step. All these parts and portions together form the housing 1.

The housing 1 is provided with a ventilating hole 3 continuing from the interior of the case portion 1b to the exterior of the connector portion 1a to lessen an internal pressure change in the case portion 1b occurring with an ambient temperature change.

The ventilating hole 3 includes a bottomed exterior opening hole 1e in the connector portion 1a provided from the interior side toward the opening surface 2 of the connector portion 1a, a bottomed interior opening hole 21a provided to the primary resin mold part 21 and opening toward the interior of the case portion 1b in a direction perpendicular to the board attachment surface 1c, and a communication hole 21b provided also to the primary resin mold part 21 and connecting the exterior opening hole 1e and the interior opening hole 21a at the bottoms. Hence, the ventilating hole 3 has turns at two points in the interior and the exterior opening hole 1e and the interior opening hole 21a open in parallel directions. The ventilating hole 3 is therefore of a shape bent in a U shape when viewed in the cross-sectional direction of FIG. 1. An opening surface 4 of the interior opening hole 21a is substantially parallel to the board attachment surface 1c. A shape of an opening surface 5 on a side where the communication hole 21b connects to the exterior opening hole 1e will be described below.

A configuration of the flow measuring device will be further described along an assembly procedure.

As is shown in FIG. 1, the plate 6 is firmly fixed to the inner side of the case portion 1b of the housing 1. The electronic circuit board 7 is immovably mounted on a board mounting surface of the plate 6 and a flow detection element 8 is immovably mounted next to the electronic circuit board 7. Meanwhile, the primary resin mold part 21 integrally molded with the housing 1 is provided with the interior opening hole 21a and the communication hole 21b described above and a connector terminal 9 is also inserted therein. As is shown in FIG. 2, one end of the connector terminal 9 is an exterior connection terminal 9a disposed in the interior of the connector portion 1a to be connected to the exterior and the other end is an interior connection terminal 9b to be connected to a terminal portion of the electronic circuit board 7.

The interior connection terminal 9b and the terminal portion of the electronic circuit board 7 are connected with wires 10 by wire bonding. Likewise, the electronic circuit board 7 and the flow detection element 8 are connected with wires 10. It should be appreciated, however, that the electric connection may be established alternatively by welding or soldering.

Wire bonding connection portions and part surfaces on the electronic circuit board 7 are generally coated with a liquid of thermosetting moisture-proof protective gel 11. In this instance, in order to prevent the applied gel 11 from running inside from the opening portion of the interior opening hole 21a, a chimney-like opening wall 22 (see FIGS. 4A and 4B described below) is provided so as to protrude from the opening end of the interior opening hole 21a. The opening surface 4 of the interior opening hole 21a thus comes above the applied surface of the gel 11.

Subsequently, a cover 12 is firmly fixed to the case portion 1b of the housing 1 to cover the top surface of the primary resin mold part 21 and the top surface of the electronic circuit board 7. A bypass passage groove 12a in which air is allowed to flow through is provided on the inner surface side of the cover 12. A thermosetting adhesive material is used to fix the cover 12 herein. It should be appreciated, however, that an epoxy adhesive and other types of adhesive are also available.

The housing 1 enclosing the primary resin mold part 21, the plate 6, and the cover 12 together form the case of the flow measuring device storing the electronic circuit. In short, this portion corresponds to the electronic circuit storage case referred to herein.

The interior of the case portion 1b in which is stored the electronic circuit board 7 has a sealed structure. Hence, an internal pressure of the case portion 1b rises with a rise in ambient temperature around the case portion 1b. However, because the ventilating hole 3 is provided as has been described above, it becomes possible to lessen a rise in internal pressure.

A manufacturing method of the case of the flow measuring device of this embodiment, in particular, a manufacturing method of the housing 1 and the primary resin mold part 21 to be combined with the housing 1 will now be described using FIG. 3A through FIG. 7B.

Firstly, a molding step of the primary resin mold part 21 will be described using FIGS. 3A and 3B. As is shown in FIG. 3A, an interior opening hole forming pin 31 used to form the interior opening hole 21a and a communication hole forming pin 32 used to form the communication hole 21b are inserted into a die used to mold the primary resin mold part 21 in directions substantially perpendicular to each other until the tip ends abut on each other.

In this state, a cavity is filled with molding resin. After the molding resin is cooled and solidified, by pulling out the both forming pins 31 and 32 as is shown in FIG. 3B, the primary resin mold part 21 provided with the interior opening hole 21a and the communication hole 21b in the interior is completed.

FIG. 4A is a side view showing the primary resin mold part 21 formed according to FIGS. 3A and 3B and FIG. 4B is a plan view when FIG. 4A is viewed from the top. FIG. 4A is a cross section taken on an arrow A-A of FIG. 4B.

While the molding of the interior opening hole 21a and the communication hole 21b has been mainly described with reference to FIGS. 3A and 3B, the overall primary resin mold part 21 is of a shape shown in FIGS. 4A and 4B. More specifically, the connector terminal 9 made of metal and having the exterior connection terminal 9a stored on the side of the connector portion 1a at one end and the interior connection terminal 9b connected on the side of the electronic circuit board 7 at the other end is formed integrally with resin and held by the primary resin mold part 21. The connector terminal 9 is formed of a plurality of elongate metal rod each having a cross section of about 1 mm per side. The side of the exterior connection terminal 9a is bent at substantially 90 degrees with respect to the side of the interior connection terminal 9b and the connector terminal 9 is formed integrally with the primary resin mold part 21 up to a midpoint by rein molding in the primary resin molding step described above.

Also, as has been described, the opening wall 22 one step higher than the periphery is provided to the opening end of the interior opening hole 21a. Accordingly, when the electronic circuit board 7 is attached and the moisture-proof protective gel 11 is applied thereon, the gel 11 is prevented from running into the interior opening hole 21a. In short, the protruding height of the opening wall 22 is determined in consideration in this regard.

The connector terminal 9 is formed of thin conductors as described above. Because the exterior connection terminal 9a is a fitting portion establishing an electric connection with the connection terminal of a mating connector, positional accuracy as desired is required. Likewise, the interior connection terminal 9b serving as a connection terminal with the electronic circuit board 7 is connected to the electronic circuit board 7 by wire bonding. Hence, positional accuracy as desired is required for the respective connection terminals.

Carrying out resin molding of the connector terminal 9 integrally with the entire housing 1 of a large resin capacity poses a problem that the connection terminals are pushed by a molding resin pressure and readily undergo deformation, thereby making it difficult to ensure positional accuracy.

In this embodiment, however, because the connector terminal 9 is molded integrally with the primary resin mold part 21 using a small amount of resin while immovably holding the periphery of the both connection terminals at the stage of the primary resin molding, the connector terminal 9 is not pushed and bent by a molding resin pressure. It thus becomes possible to obtain the primary resin mold part 21 while ensuring the positional accuracy of the both connection terminals 9a and 9b.

It should be appreciated that providing the interior opening hole 21a and the communication hole 21b forming a part of the ventilating hole 3 and immovably holding the connector terminal 9 with resin may be carried out separately in the primary resin molding step. However, because a space is limited for the electronic control unit employed in an internal combustion engine, the number of components, the cost, and the size can be reduced by carrying out these two operations simultaneously with the integral resin molding of the primary resin mold part 21.

A secondary resin molding step of forming the entire housing 1 including the exterior opening hole 1e will now be described. FIG. 5 is a cross section showing placement of dies during the secondary resin molding. FIG. 6 is a cross section of a major portion of FIG. 5. FIGS. 7A and 7B are views used to describe a molding process of the connector portion 1a.

In the secondary resin molding step, as is shown in FIG. 5, a molding die A 33, a molding die B 34, and a molding die C 35 of the housing 1 are combined vertically and horizontally and the primary resin mold part 21 preliminarily manufactured is held and fixed at a predetermined position in the combined dies. In this instance, in order to form the inner surface of the connector portion 1a and the exterior opening hole 1e of the housing 1 simultaneously, a connector inner surface forming portion 33a used to form the interior of the connector portion 1a and an exterior opening hole forming pin 33b used to form the exterior opening hole 1e are formed integrally with the molding die A 33 so as to protrude therefrom.

As is shown in FIG. 6, the tip end of the exterior opening hole forming pin 33b is disposed so as to close the opening surface 5 of the communication hole 21b in the primary resin molding portion 21 formed by the primary resin molding so that the molding resin is prevented from flowing into the communication hole 21b. In the case of the first embodiment, the opening surface 5 is perpendicular to a hole direction of the communication hole 21b and of a planar shape. When configured in this manner, fitting surfaces of the opening surface 5 of the communication hole 21b and the tip end of the exterior opening hole forming pin 33b are shaped like a plane. Accordingly, because the planes are fit together, the fitting surfaces come into close contact with high accuracy, which makes it difficult for the molding resin to run into the communication hole 21b.

In addition, the molding die A 33 is formed to close also the opening surface 4 of the interior opening hole 21a in the primary resin molding portion 21.

A cavity in the dies is filled with the molding resin in the condition of FIG. 5. In this instance, because the opening surfaces 4 and 5 of the primary resin mold part 21 are closed with the molding die A 33 as described above, it becomes possible to prevent the molding resin from running into the interior opening hole 21a from the opening surface 4 and into the communication hole 21b from the opening surface 5.

FIGS. 7A and 7B are views showing a molding process of the connector portion 1a when viewed in the direction indicated by an arrow B-B of FIG. 5. The flange portion 1d of the housing 1 is not shown in the drawing. As is shown in FIG. 7A, the exterior opening hole forming pin 33b is disposed in the interior of the connector portion 1a so as to close the opening surface 5 of the communication hole 21b with the tip end thereof. In this instance, a dimension at least as same as an outside diameter dimension of the communication hole 21b is sufficient for a dimension of the exterior opening hole forming pin 33b in the width direction. It is, however, preferable to make the dimension of the exterior opening hole forming pin 33b in the width direction larger than the outside diameter dimension of the communication hole 21b in order to close the opening surface 5 of the communication hole 21b in a more reliable manner. In short, it is sufficient that the exterior opening hole 1e finally has a passage sectional area larger than a passage sectional area of the communication hole 21b.

When configured in this manner, it becomes possible to prevent the molding resin from flowing into the communication hole 21b during the secondary resin molding in a reliable manner.

Subsequently, after the filling of the molding resin is completed, the molding resin is allowed to cool and solidify. Thereafter, as is indicated by blank arrows in FIG. 5, the molding die A 33, the molding die B 34, and the molding die C 35 are opened. By opening these dies, as is shown in FIG. 7B, the connector inner surface forming portion 33a and the exterior opening hole forming pin 33b provided to the molding die A 33 are pulled out. The housing 1 after the completion of the secondary resin molding as is shown in FIG. 8 is thus completed. In FIG. 8, portions other than the primary resin molding portion 21, that is, portions forming the outer shape including the connector portion 1a, the case portion 1b, and the flange portion 1d correspond to the secondary resin mold part 36 (as shown in FIG. 1).

As is shown in FIG. 8, owing to the primary resin molding step and the secondary resin molding step, the completed housing 1 is provided with the ventilating hole 3 having two turns at right angles and allowing a communication in the housing 1 from the interior of the case portion 1b to the exterior of the connector portion 1a.

The exterior connection terminal 9a on the side of the connector portion 1a and the interior connection terminal 9b connected to the electronic circuit board 7 are positioned by the primary resin molding and a desired resin portion is provided on the periphery of the connector terminal 9. Hence, the connector terminal 9 is not forced to undergo deformation by a molding resin pressure during the secondary resin molding and it is kept at a predetermined position with high accuracy even after the secondary resin molding.

As has been described, according to the electronic circuit storage case of the first embodiment, an electronic circuit storage case is provided with a ventilating hole continuing from an interior of a case portion to an exterior of a connector portion in a solid portion of a housing. An interior opening hole and a communication hole are bent in an L shape and provided to a primary resin mold part forming the housing. An exterior opening hole is provided to a secondary resin mold part of the housing enclosing the primary resin mold part and forming the connector portion and the case portion so as to communicate with one end of the L-shaped communication hole substantially perpendicularly. Accordingly, a ventilating hole having two turns and allowing the case portion and the connector portion to communicate can be provided readily in a reliable manner merely by molding and an internal pressure change in the resin case can be lessened. It thus becomes possible to obtain an electronic circuit storage case provided with a highly reliable ventilating hole.

Also, a connector terminal having an exterior connection terminal on a side of the connector portion at one end and an interior connection terminal on a side of the electronic circuit board at the other end is molded integrally with the primary resin mold part. Hence, the connector terminal is not forced to undergo deformation by a molding resin pressure during the secondary resin molding. Accordingly, in addition to the advantage described above, it becomes possible to position the connector terminal in the housing with high accuracy. Also, a reduction of the manufacturing costs and a size reduction of the case can be achieved.

Also, the primary resin mold part is provided with an opening wall on a periphery of the interior opening hole, so that when moisture-proof protective gel is applied on an electronic part mounting portion 37 (as shown in FIG. 2) and a connection portion of the electronic circuit board stored in the case portion, an opening surface of the interior opening hole is above a gel applied surface. Hence, when the electronic circuit board is attached and the moisture-proof protective gel is applied thereon, it becomes possible to prevent the gel from running into the interior opening hole.

Figure 7C:
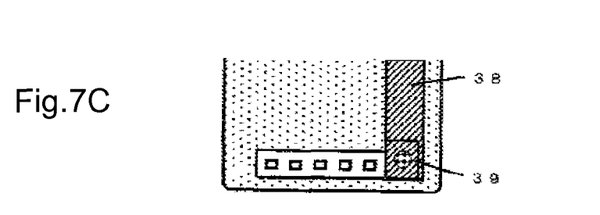
FIG. 7C is a close-up view of a portion of FIG. 7A.

Also, as shown in FIG. 7C, a passage sectional area of the exterior opening hole 38 provided to the secondary resin mold part is made larger than a passage sectional area of the communication hole 39 provided to the primary resin mold part. Hence, the exterior opening hole and the communication hole are not closed and allowed to communicate in a reliable manner in the process of the secondary resin molding. It thus becomes possible to obtain an electronic circuit storage case provided with a highly reliable ventilating hole.

Also, an opening surface of the communication hole on a side communicating with the exterior opening hole is formed perpendicularly to a hole direction of the communication hole. Hence, an exterior opening hole forming pin and the opening surface of the communication hole fit together in planes when the secondary resin mold part is molded. The fitting surfaces therefore come into close contact with each other at high accuracy. It thus becomes possible to prevent the molding resin from running into the communication hole in a reliable manner.

Further, according to a manufacturing method of the electronic circuit storage case configured as above, the primary resin mold part provided with the interior opening hole and the communication hole bent in an L shape is molded in a primary resin molding step where the housing is molded and the entire housing including the connector portion and the case portion is formed in a secondary resin molding step together with the exterior opening hole connected to one end of the L-shaped communication hole substantially perpendicularly by holding the primary resin mold at a predetermined position in dies and filling a cavity therein with resin. Accordingly, a ventilating hole having two turns and allowing the case portion and the connector portion to communication can be provided readily in a reliable manner merely by molding and an internal pressure change in the resin case can be lessened. It thus becomes possible to obtain an electronic circuit storage case provided with a highly reliable ventilation portion.

Second Embodiment

Figure 9:
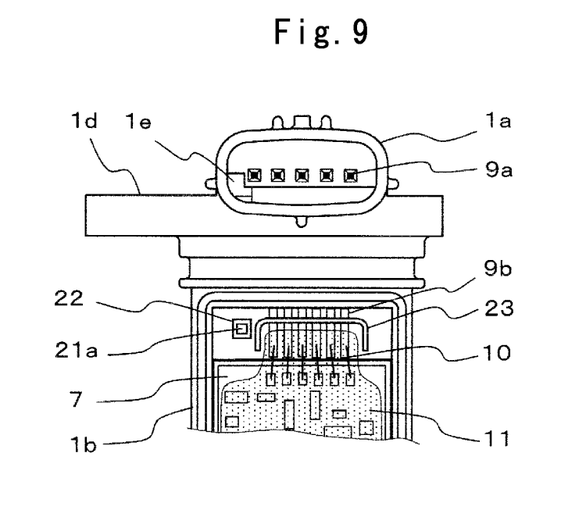
FIG. 9 is a front view of a major portion of a flow measuring device according to a second embodiment of the invention after a plate on which is mounted an electronic circuit board is bonded to a housing.

FIG. 9 is a front view of a major portion in a flow measuring device according to a second embodiment of the invention. The second embodiment is basically of the same configuration as that of the first embodiment shown in FIG. 1 and FIG. 2. FIG. 9 shows a portion corresponding to the portion shown in FIG. 2 but it shows the interior made visible by removing the cover 12. That is, FIG. 9 is a front view after the plate 6 on which is mounted the electronic circuit board 7 is attached to the housing 1. A description of the same portions as those in FIG. 1 and FIG. 2 is omitted and a difference will be chiefly described herein.

As with the first embodiment above, the primary resin mold part 21 of the housing 1 is provided with the interior opening hole 21a and the opening wall 22 is provided to the opening portion thereof. Also, the moisture-proof protective gel 11 is applied on the connection portion of the interior connection terminal 9b of the connector terminal 9 and the electronic circuit board 7 and on the surfaces of the electronic parts.

This embodiment is characterized in that a partition wall 23 is provided in the vicinity of the interior opening hole 21a in the housing 1 to block a flow of the gel 11. The partition wall 23 is spaced apart from the opening wall 22.

A liquid of thermosetting adhesive is normally used as the gel 11. A liquid of the gel 11 therefore become less viscous under high temperature and wets and spreads on the periphery. Owing to the configuration of this embodiment, however, it becomes possible to prevent the gel 11 from spreading on the periphery while the gel 11 is being applied on the electronic circuit board 7 and the wires 10. Even when the gel 11 wets and spreads on the periphery under high temperature, the gel 11 is blocked by the partition wall 23 and does not reach the interior opening hole 21a. It thus becomes possible to prevent the gel 11 from running into the interior opening hole 21a to close the ventilating hole 3 or the gel 11 from flowing to the exterior of the connector portion 1a.

It is effective to provide the partition wall 23 together with the opening wall 22 as is shown in FIG. 9. It should be appreciated, however, that an effect of preventing the gel 11 from running inside or flowing outside can be expected by providing either one of these walls alone.

As has been described, the electronic circuit storage case of the second embodiment is provided with the partition wall in the vicinity of the interior opening hole in the primary resin mold part in order to prevent the moisture-proof protective gel from flowing into the interior opening hole when the gel is applied on the electronic part mounting surface and the connection portion of the electronic circuit board stored in the case portion. Hence, when the gel is applied on the electronic circuit board and the wires, the partition wall blocks the gel flowing and spreading to the vicinity. The gel therefore does not reach the interior opening hole. It thus becomes possible to prevent the gel from closing the ventilating hole and the gel from flowing to the exterior of the connector portion.

Third Embodiment

Figure 10:
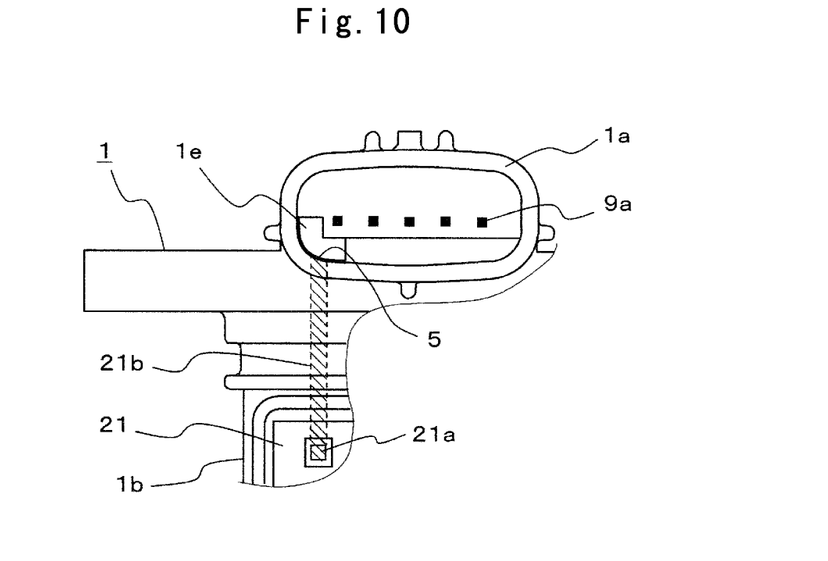
FIG. 10 is a front view of a major portion including a connector portion of a housing of a flow measuring device according to a third embodiment of the invention.
Figure 11:
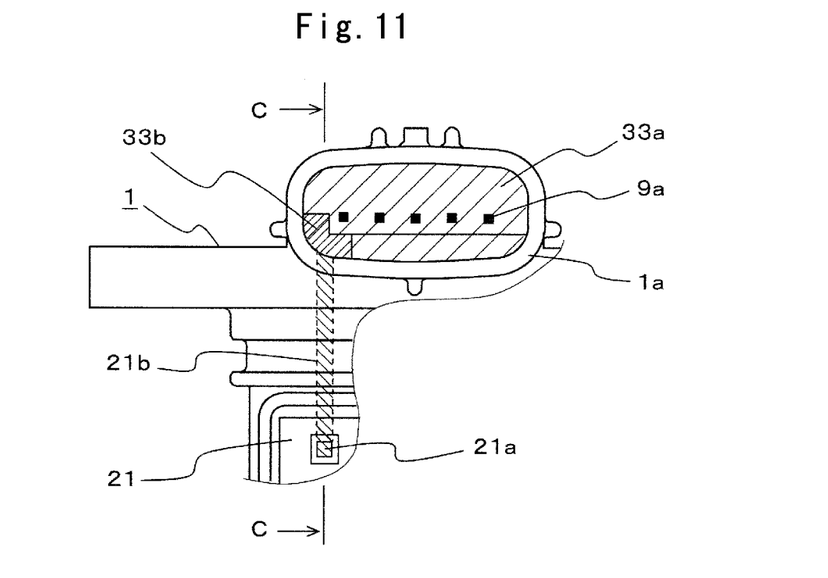
FIG. 11 is a front view showing placement of dies when the connector portion of the housing of FIG. 10 is molded by secondary resin molding.
Figure 12:
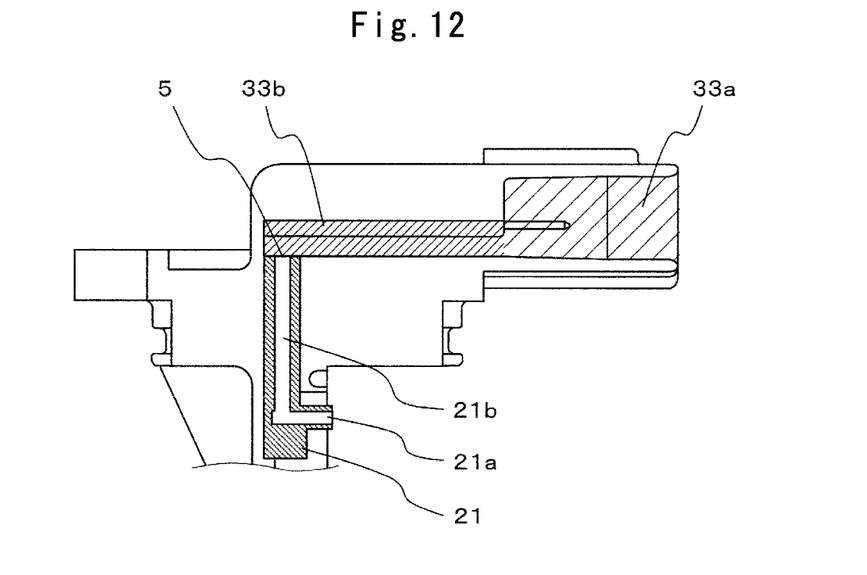
FIG. 12 is a sectional side view taken on an arrow C-C of FIG. 11.
Figure 13:
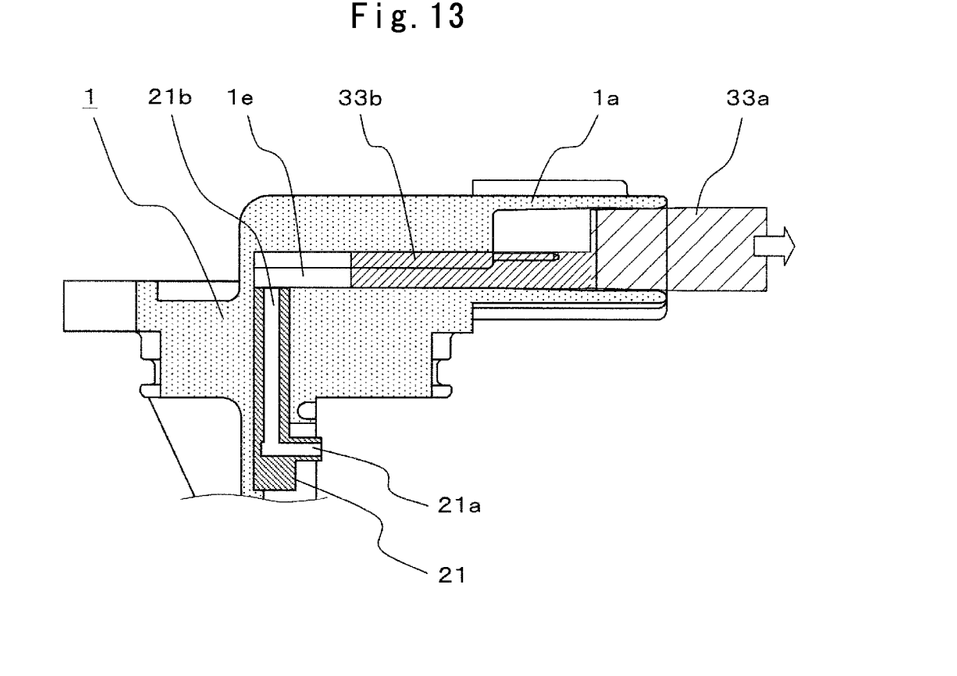
FIG. 13 is a cross section used to describe an opening operation of a die used to mold the inner side of the connector portion and an exterior opening hole forming pin in FIG. 11.

FIG. 10 is a front view of a flow measuring device according to a third embodiment of the invention showing a partially cut-out housing 1. FIG. 11 is a front view showing placement of a die used to mold the inner side of a connector portion 1a during secondary resin molding of the housing 1 of FIG. 10. FIG. 12 is a cross section of the housing 1 taken on the arrow C-C of FIG. 11. FIG. 13 is a cross section when the die used to mold the inner side of the connector portion 1a of FIG. 12 is opened. Configurations other than those shown in these drawings are the same as those of the first embodiment or the second embodiment.

As is shown in FIG. 10, the exterior opening hole 1e is provided in the secondary resin molding step of the housing 1. Herein, it should be noted that a part of the inner wall of the exterior opening hole 1e has an inner wall portion formed on the same plane as a part of the inner wall of the connector portion 1a. This portion is indicated by a solid line in the drawing.

The opening surface 5 of the communication hole 21b formed by the primary resin molding of the housing 1 and communicating with the exterior opening hole 1e is also formed on the same plane as the inner wall portion of the exterior opening hole 1e indicated by the solid line.

In short, a part of the inner wall of the connector portion 1a, a part of the inner wall of the exterior opening hole 1e, and the opening surface 5 are on the same plane. This configuration can be achieved as follows.

As has been described above, the connector inner surface forming portion 33a used to mold the inner side of the connector portion 1a and the exterior opening hole forming pin 33b provided at the tip end side are formed integrally with the die A 33. However, as is shown in FIG. 11, the die A 33 is prepared in such a manner that a part of the outer surface of the connector inner surface forming portion 33a and a part of the outer surface of the exterior opening hole forming pin 33b are on the same plane. This configuration can be achieved by merely extending a part of the connector inner surface forming portion 33a in a depth direction of the connector portion 1a. Accordingly, a die can be readily manufactured.

Also, the opening surface 5 of the communication hole 21b is shaped so that the opening surface 5 is on the same plane as the outer surface of the exterior opening hole forming pin 33b. When configured in this manner, as is shown in FIG. 12, it becomes possible to close the opening surface 5 of the communication hole 21b with the tip end of the exterior opening hole forming pin 33b.

A cavity is filled with molding resin while dies are placed as shown in FIG. 12 and the molding resin is allowed to cool and solidify. Then, as is shown in FIG. 13, by opening the dies and pulling out the connector inner surface forming portion 33a and the exterior opening hole forming pin 33b of the die A 33 in the direction indicated by an arrow, the exterior opening hole 1e is formed without the communication hole 21b being closed.

As has been described, according to the electronic circuit storage case of the third embodiment, the exterior opening hole has the inner wall portion formed on the same plane as a part of the inner wall of the connection portion and the opening surface of the communication hole on the side communicating with the exterior opening hole is formed on the same plane as this inner wall portion. Hence, a die used to mold the secondary resin mold part can be readily manufactured.

The first through third embodiments above have described the flow measuring device as an example of the electronic circuit storage case. It should be appreciated, however, that the invention is also applicable to an electronic circuit storage case of various electronic control units having a case storing electronic circuits as a component.

Various modifications and alterations of this invention will be apparent to those skilled in the art without departing from the scope and spirit of this invention, and it should be understood that this is not limited to the illustrative embodiments set forth herein.

What is claimed is:

1. An electronic circuit storage case, comprising:
   a housing made of resin and having a case portion that stores an electronic circuit board and a connector portion that extends in a direction perpendicular to a board attachment surface of the case portion,
   wherein the housing contains a primary resin mold part and a secondary resin mold part,
   wherein:
   an interior opening hole opening towards an interior of the case portion and an exterior opening hole opens toward an exterior connector portion;
   a ventilating hole continuing from the interior of the case portion to the exterior of the connector portion is provided in a solid portion of the housing;
   a communication hole connecting the exterior opening and the interior opening,
   the interior opening hole and the communication hole connect in an L shape, forming an L-shaped communication hole, and provided to the primary resin mold part; and
   the exterior opening hole is provided to the secondary resin mold part of the housing enclosing the primary resin mold part and forming the connector portion and the case portion so as to contact substantially perpendicularly with one end of the L-shaped communication hole,
   wherein the L-shaped communication hole is located in the primary resin mold part and the exterior opening hole is located in the secondary resin mold part, and
   wherein the primary resin mold part and secondary resin mold part are separate resin molds and the secondary resin mold part encloses the primary resin part.

2. The electronic circuit storage case according to claim 1, wherein:
   a connector terminal having an exterior connection terminal on a side of the connector portion at one end and an interior connection terminal on a side of the electronic circuit board at the other end is molded integrally with the primary resin mold part.

3. The electronic circuit storage case according to claim 1, wherein:
   the primary resin mold part is provided with an opening wall on a periphery of the interior opening hole, so that when moisture-proof protective gel is applied on an electronic part mounting portion and a connection portion of the electronic circuit board stored in the case portion, an opening surface of the interior opening hole is above a gel applied surface.

4. The electronic circuit storage case according to claim 1, wherein:
   the primary resin mold part is provided with a partition wall in a vicinity of the interior opening hole, so that when moisture-proof protective gel is applied on an electronic part mounting portion and a connection portion of the electronic circuit board stored in the case portion, the gel is prevented from flowing into the interior opening hole.

5. The electronic circuit storage case according to claim 1, wherein:
   a passage sectional area of the exterior opening hole provided to the secondary resin mold part is larger than a passage sectional area of the communication hole provided to the primary resin mold part.

6. The electronic circuit storage case according to claim 1, wherein:
   an opening surface of the communication hole on a side communicating with the exterior opening hole is formed perpendicularly to a hole direction of the communication hole.

7. The electronic circuit storage case according to claim 1, wherein:
   the exterior opening hole has an inner wall portion formed on a same plane as a part of an inner wall of the connector portion and an opening surface of the communication hole on a side communicating with the exterior opening hole is formed on a same plane as the inner wall portion.

8. A manufacturing method of an electronic circuit storage case including a housing made of resin and having a case portion that stores an electronic circuit board and a connector portion that extends in a direction perpendicular to a board attachment surface of the case portion, in which an interior opening hole opening toward an interior of the case portion and an exterior opening hole opens toward an exterior of the connector portion and a ventilating hole continuing from the interior of the case portion to the exterior of the connector portion is provided in a solid portion of the housing, the method comprising:

molding a primary resin mold part having the interior opening hole and a communication hole bent in an L shape, forming an L-shaped communication hole, in a primary resin molding step where the housing is molded; and     forming the entire housing including the connector portion and the case portion in a secondary resin molding step together with the exterior opening hole contacted to one end of the L-shaped communication hole substantially perpendicularly by holding the primary resin mold part at a predetermined position in dies and filling a cavity therein with resin,     wherein the L-shaped communication hole is located in the primary resin mold part and the exterior opening hole is located in the secondary resin mold part, and     wherein the primary resin mold part and secondary resin mold part are separate resin molds and the secondary resin mold part encloses the primary resin mold part.

\* \* \* \* \*